United States Patent [19]

Bean et al.

[11] 3,905,037

[45] Sept. 9, 1975

[54] INTEGRATED CIRCUIT COMPONENTS IN INSULATED ISLANDS OF INTEGRATED SEMICONDUCTOR MATERIALS IN A SINGLE SUBSTRATE

[75] Inventors: Kenneth E. Bean, Richardson; George R. Cronin, Dallas, both of Tex.

[73] Assignee: Texas Instruments Incorporated, Dallas, Tex.

[22] Filed: June 11, 1969

[21] Appl. No.: 843,268

Related U.S. Application Data

[62] Division of Ser. No. 606,352, Dec. 30, 1966, abandoned.

[52] U.S. Cl. ........................ 357/60; 29/576; 29/577; 29/578; 117/201; 117/212; 148/174; 148/175; 357/17; 357/44; 357/49; 357/51; 357/59

[51] Int. Cl.$^2$ ................ H01L 21/70; H01L 27/02; H01L 29/04

[58] Field of Search ....... 148/1 S, 174, 175; 117/33, 117/201, 212, 213; 156/17; 317/101, 234, 17/235; 29/576–578, 588–589; 357/60, 49, 51

[56] References Cited

UNITED STATES PATENTS

| | | | |
|---|---|---|---|
| 3,133,336 | 5/1964 | Marinace | 148/175 X |
| 3,256,587 | 6/1966 | Hangstefer | 317/101 X |
| 3,320,485 | 5/1967 | Buie | 317/101 |
| 3,372,070 | 3/1968 | Zuk | 148/175 X |
| 3,400,309 | 9/1968 | Doo | 317/234 |
| 3,401,450 | 9/1968 | Godejahn | 29/580 |
| 3,433,686 | 3/1969 | Marinace | 148/175 |
| 3,461,003 | 8/1969 | Jackson | 148/175 |
| 3,471,754 | 10/1969 | Hoshi et al. | 317/235 |

*Primary Examiner*—L. Dewayne Rutledge
*Assistant Examiner*—W. G. Saba
*Attorney, Agent, or Firm*—Harold Levine; James T. Comfort; Gary C. Honeycutt

[57] ABSTRACT

This invention relates to a monolithic integrated circuit in a substrate of a first semiconductor material containing electrically insulated islands of other different semiconductor materials. Preferably each of the islands is isolated from the substrate and from each other by an insulating layer of material. Thus an integrated circuit can be manufactured in a single substrate in accordance with the particular needs of the circuit functions required.

4 Claims, 13 Drawing Figures

Figure 1A:
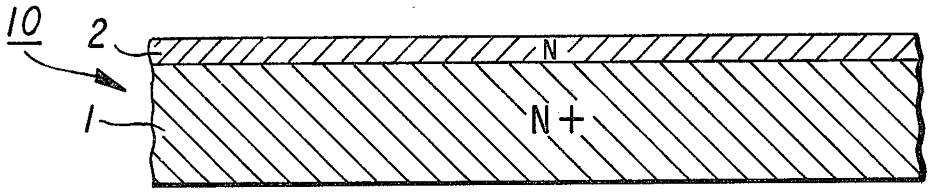

INVENTORS
Kenneth E. Bean
George R. Cronin
BY Kenneth R. Glaser
ATTORNEY

ATTORNEY

INTEGRATED CIRCUIT COMPONENTS IN INSULATED ISLANDS OF INTEGRATED SEMICONDUCTOR MATERIALS IN A SINGLE SUBSTRATE

This invention generally relates to integrated circuits and methods of making the same. More particularly, it relates to a monolithic integrated circuit in a single substrate, said substrate containing electrically insulated islands of different semiconductor materials, as prescribed by a particular circuit function, in which components of the integrated circuit are formed. According to the present invention, an integrated circuit can be comprised of circuit components formed both in the islands and in the substrate itself.

Monolithic integrated circuits of the type having a number of interconnected circuit components in a common semiconductor substrate, such as silicon, for example, have become widely used in recent years. Integrated circuits take many forms and can be fabricated in many ways using, for example, different combinations of conventional diffusion methods, etching and epitaxial deposition techniques. According to the present state of the art, however, whatever the method used, monolithic circuits involve the fabrication of different circuit components from a single semiconductor material, the semiconductor material used for each component being essentially the same as the material of the substrate in which the components are formed, the substrate material being modified, of course, by appropriate dopants. For example, a monolithic integrated logic circuit for computer applications is made by fabricating all the circuit components of silicon in a common silicon substrate, the desired interconnections being on an insulation layer on the surface of the substrate. All the parameters of the individual components are, by necessity, determined by the inherent properties of silicon as influenced by appropriate impurity modifiers.

In applications where the required component parameters are too diverse to enable a common substrate material to be used for the fabrication of all the components, or where a semiconductor substrate does not furnish the desired substrate properties, the monolithic integrated circuit approach is not used. One circuit, for example, that does not lend itself at the present time to the monolithic integrated circuit approach is a light emitter diode array for read-only memory applications. On the other hand, in cases where the different component parameters are similar, a common substrate is used, but many of the desired parameters of each component may be compromised to the extent that maximum efficiency and effect cannot be realized from each individual component. Thus, circuits that combine power and high speed switching components, for example, could be fabricated with better circuit parameters or smaller packaging if a silicon power component and a germanium switching component could be combined in a single substrate. Instead, either one of two approaches is now used, namely, fabricating the circuit monolithically in silicon with a compromise in circuit parameters, or using a wafer of silicon for the power equipment and a wafer of germanium for the switching component. The latter approach obviously results in an increased package size and manufacturing cost for the combined devices.

It is an object of the present invention to provide a method of forming "islands" of semiconductor materials in a single substrate in order to permit the formation of different circuit components from different semiconductor materials in a single substrate. An island in this application is defined as a quantity or body of semiconductor material disposed in a substrate (e.g., in a hole formed completely through the substrate) and surrounded by the substrate material which is different from the semiconductor material.

Another object of the invention is to provide a method of forming islands electrically insulated from each other and formed of different semiconductor materials in a single substrate.

Yet another object of the invention is to provide a method of forming an integrated circuit comprising circuit components in islands of different semiconductor materials in a substrate.

Yet another object of the invention is to provide a method of forming an integrated circuit comprising circuit components in islands electrically insulated or isolated from each other and formed of different semiconductor materials in a semiconductor substrate with some of the components formed in the substrate itself.

Yet another object of the invention is the provision of a plurality of islands of different semiconductor materials in a substrate.

Still another object of the invention is an integrated circuit comprising circuit components in islands of different semiconductor materials in a substrate.

A further object of the invention is an integrated circuit comprising certain of the components formed in islands of different semiconductor materials in a semiconductor substrate with some of the components formed in the substrate itself.

Figure 1B:
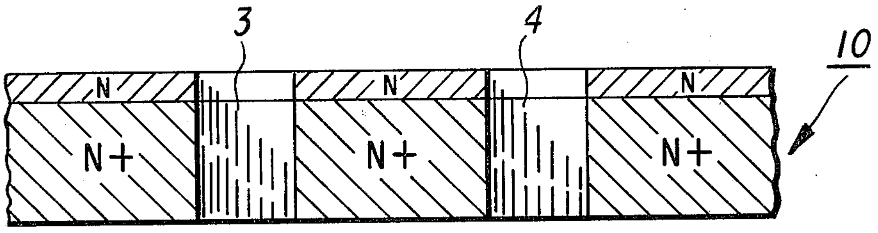
Figure 1C:
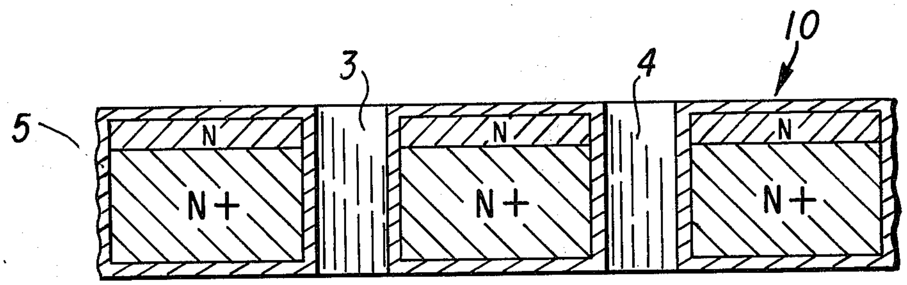
Figure 1D:
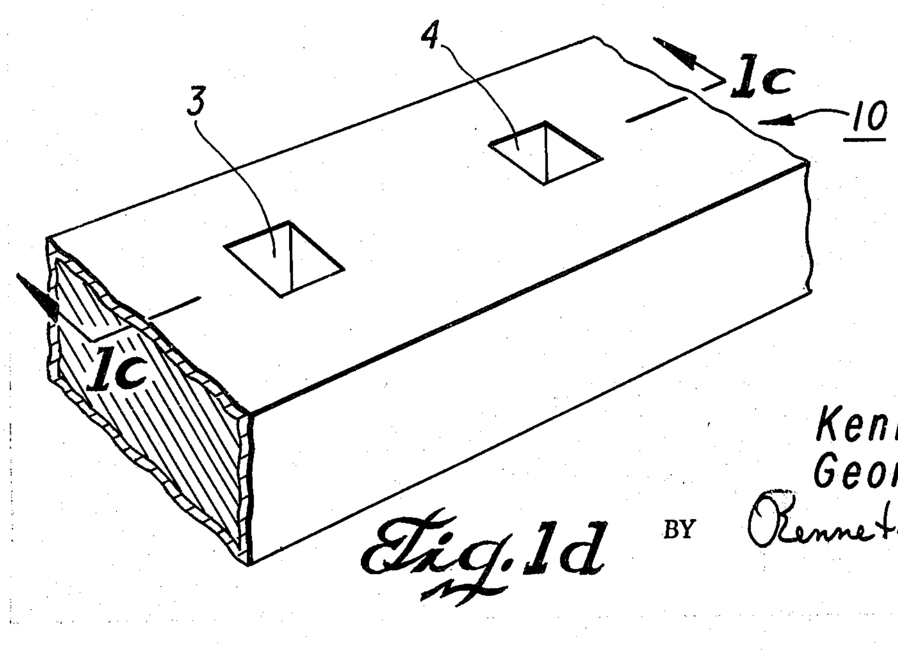
Figures 2, 3A:
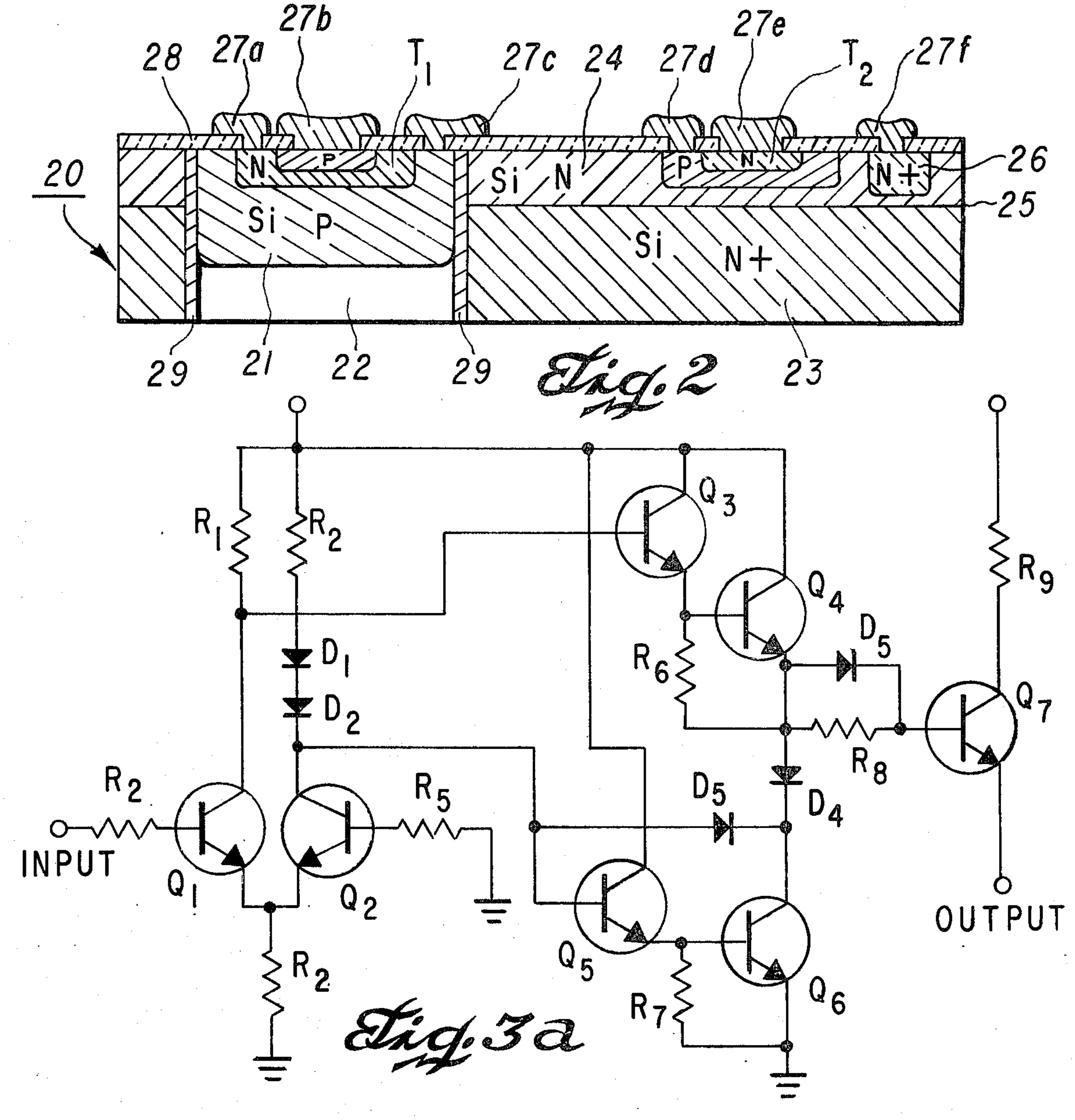
Figure 3B:
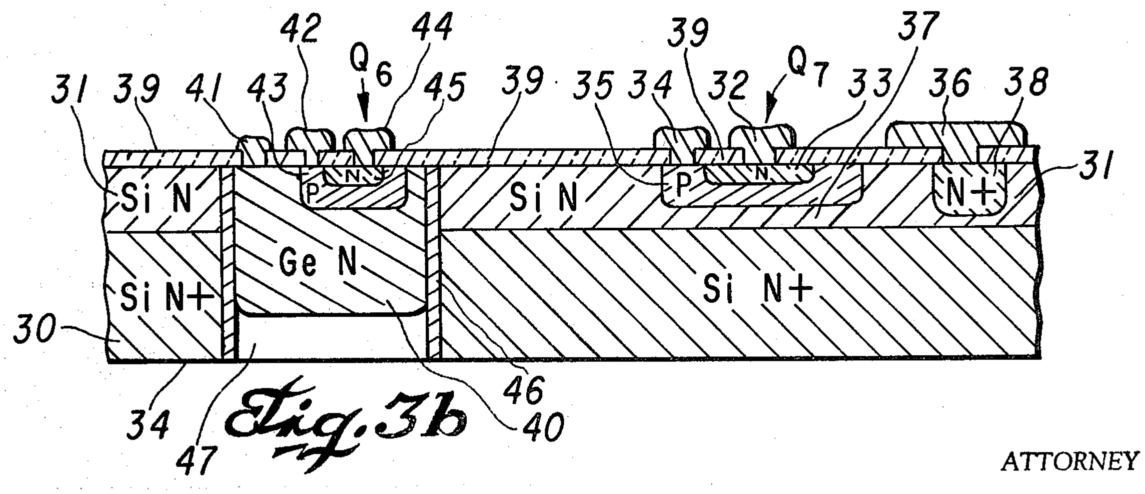
Figure 4A:
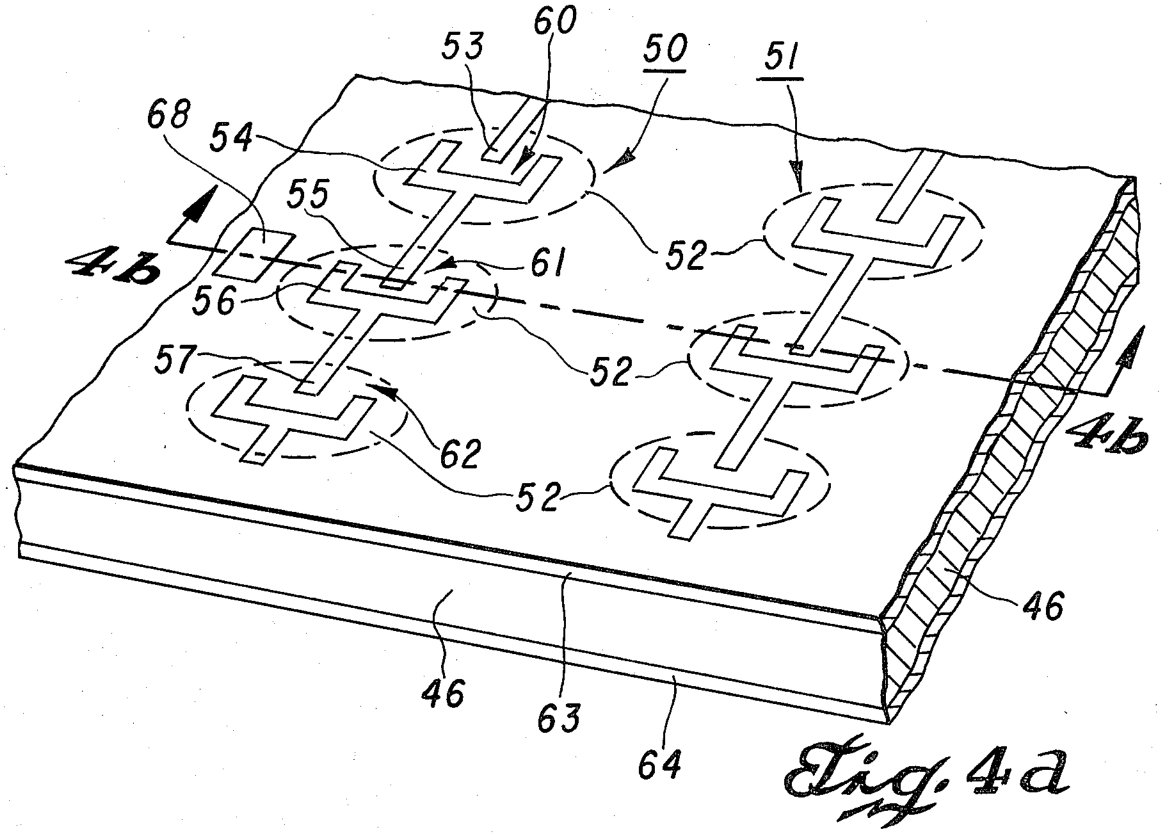
Figure 4B:
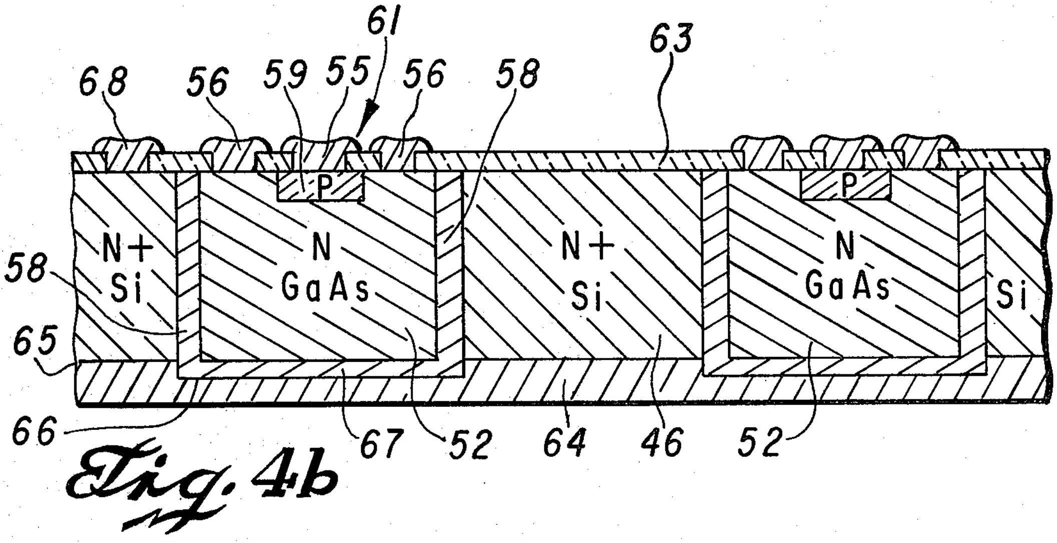

The novel features believed to be characteristic of the invention are set forth with particularity in the appended claims. The invention itself, however, as well as further objects and advantages thereof may best be understood by reference to the following detailed description, when read in conjunction with the accompanying drawings wherein:

FIG. 1*a* is a sectional view of an N+ conductivity type starting substrate with a N conductivity type layer epitaxially grown over one surface thereof;

FIG. 1*b* is a sectional view of a substrate following the hole formation;

FIG. 1*c* is a sectional view of the substrate taken along the line 1*c*—1*c* of FIG. 1*d*, illustrating the electrically insulated holes produced in the substrate according to the invention;

FIG. 1*d* is an isometric view of the substrate showing the holes in the substrate illustrated in cross-section in FIG. 1*c*;

FIGS. 1*e* – 1*h* are sectional views of the substrate illustrating the steps of forming islands of two different semiconductor type materials in insulated holes;

FIG. 2 is a sectional view of a portion of a monolithic integrated circuit illustrating silicon N-P-N and P-N-P transistors made according to the invention;

FIG. 3*a* is a schematic diagram of an emitter coupled logic circuit having both power and high speed transistors;

FIG. 3*b* is a sectional view of a portion of a monolithic integrated circuit illustrating one of the switching transistors in a germanium island and the power transistor as shown in FIG. 3*a* in a silicon substrate;

FIG. 4*a* is an isometric view of a portion of light-emitting diode array for a read-only memory, showing the diode components fabricated in semiconductor islands of gallium arsenide formed in a silicon substrate;

FIG. 4*b* is a sectional view of a portion of the diode circuit shown in FIG. 4*a* taken along the line 4*b*—4*b* of FIG. 4*a*.

Briefly, the invention involves the fabrication of the components of an integrated circuit, and particularly a monolithic integrated circuit, in islands of semiconductor material within a single substrate, the semiconductor material in each island being specific to and having the conductivity type required by the component function, which are either necessitated by the component itself or for enhancing the component parameters. The substrate itself can additionally comprise and furnish a particular semiconductor type material, if so desired. Examples of such circuit components are light-emitting diodes formed of gallium arsenide (GaAs), infra-red detectors formed of cadmium sulfide (CdS) or indium arsenide (InAs), high speed switching transistors formed of germanium (Ge) and power transistors formed of silicon (Si).

The monolithic circuit structure comprising islands of different semiconductor type materials in a single substrate is produced by forming holes through the substrate, for example by any suitable method, such as ultrasonic and electron beam cutting. To prevent growth from the walls of the holes and the surface of the substrate of the subsequentyl formed semiconductor material in each hole, and to form an electrically insulating isolation layer between the semiconducting material in the holes and the remainder of the substrate when the substrate is formed of a metal or a semiconductor material, a layer of insulating material is deposited upon or formed on the surface of the substrate, including the inner walls of the holes. When the substrate is not of a metal or a semiconductor material, such as a nonconductive ceramic, for example, the step of forming an insulating layer on the inside walls of the holes is not necessary. The substrate with the insulated holes therein is placed on a surface of a seed crystal of a desired monocrystalline semiconductor within a conventional reactor furnace. According to another feature of the invention, more than one type of semiconductor material can be grown, respectively, within different holes, in which event all of the required holes can be formed at once. A number of holes are blocked off by placing a thin strip of material on a portion of the top surface of the substrate, blocking the holes which are to be filled subsequently with other types of semiconductor material or only the holes to be filled with a particular semiconductor material need be formed. The remaining holes are then formed, as needed, prior to each deposition step of a different semiconductor material. The atmosphere in the reactor furnace, made up of the desired semiconductor material combined with other elements in the gaseous phase, is introduced into the reactor furnace, is allowed to penetrate the open holes and is deposited upon the portions of the underlying seed crystal (usually single or monocrystalline) exposed by the open holes, whereupon single crystal semiconductor material is epitaxially grown from the crystal single seed in each of the exposed holes. The epitaxial material extends the lattice arrangement (crystal orientation) of the monocrystalline seed crystal up into the holes in the substrate.

After sufficient growth of the semiconductor material in the holes to form islands is obtained, the substrate and the seed crystal assembly is removed from the furnace. The seed crystal is removed from the substrate, as by lapping or etching for example, to leave the semiconductor substrate with islands of a semiconductor material insulated from the substrate. The preceeding deposition process is repeated any number of times depending upon the number of different semiconductor materials that are desired to be formed as islands in the substrate. The substrate is then ready for fabrication of the desired circuit components in each island and in the substrate itself if the substrate is a semiconductor material.

Referring now to the drawings, FIG. 1*a* shows a sectional view of a N+ conductivity type substrate 1 of single crystal silicon with an epitaxially deposited N conductivity type layer 2 of single crystal silicon upon a surface thereof. For ease of description, the substrate 1 and deposited layer 2 will be referred to as a substrate of silicon, and the whole will be generally designated by the numeral 10 as the substrate passes through subsequent operations. Depending upon the desired integrated circuit, the substrate 10 can be made from any one of many materials, for example semiconductors such as germanium (Ge), silicon (Si), gallium arsenide (GaAs), cadmium sulfide (CdS) and indium arsenide (InAs), insulating materials, for example ceramics such as aluminum oxide ($Al_2O_3$), beryllium oxide (BeO) and silicon carbide (SIC) or refractory metals such as molybdenum. It should be noted at the start that substrate 10 will usually be a part of a large slice of semiconductor or insulating material comprising a large number of areas similar to substrate 10. Following the completion of component fabrication, each substrate may be separated from the parent slice and made into an individually packaged integrated circuit or remain on the slice to have components of one substrate to be interconnected with components of other substrates. In addition, it should be noted that the figures of the drawings are not to scale, with dimensions of parts exaggerated for clarity of illustration, emphasis being placed upon the best visual representation of the invention.

The particular details of epitaxial deposition of the N conductivity type layer 2 on the substrate 1 need not be described for the details are well known in the art. If a low resistivity region in the substrate is not required by the design of the subsequently formed components, the substrate can be of N conductivity type material, thus dispensing with the N+ conductivity type layer deposition step. Also if so desired, a number of epitaxial processes can be used to form several layers on the substrate instead of the one described, or semiconductor regions can be diffused into the substrate before the subsequent island fabrication. For example, when components are to be formed within the substrate itself, the components can be formed before fabricating the islands. The substrate 10 can be either P or N conductivity type semiconductor material, such as germanium or silicon, for example, if the substrate itself is to be used for circuit component formation. If not, the substrate, for example, can be made of polycrystalline silicon, a refractory metal, or any suitable ceramic type material.

In FIG. 1*b* is shown the substrate 10 after the desired number of holes, holes 3 and 4, for example, are formed which completely penetrate through the substrate. The holes 3 and 4 can be formed by any conventional method such as by the use of a cavitron or by photolithographic techniques, both processes being well known in the semiconductor art.

In order to electrically insulate and isolate the islands of semiconductor material which will be subsequently formed within holes 3 and 4 and prevent deposition on other areas of the substrate, if the substrate is a semiconductor material, a layer 5 of an insulating material such as silicon oxide, for example, is formed over the entire surface of the substrate 10, including the inner walls of the holes 3 and 4, as shown in FIG. 1*c*, the substrate 10 illustrated in FIG. 1*d* being shown in cross-section along the section line 1*c*—1*c*. Instead of silicon oxide, the insulating isolation layer 5 can be conveniently formed from other insulating materials such as silicon carbide (SiC) or silicon nitride ($Si_3N_4$). The silicon oxide layer 5 is pyrolytically deposited on the surface of the wafer 10 or thermally grown from the surface of the substrate if silicon is used as the substrate material. In this embodiment of the invention the silicon oxide layer 5 is grown by subjecting the substrate 10 to an oxidizing atmosphere of steam or dry air at about 1200°C for about one hour, which forms a layer of silicon oxide on the substrate 10 of approximately 10,000 A in thickness. Of course, and as previously stated, if the silicon oxide insulating layer in the holes is not needed, as it would not be if the substrate were a nonconducting ceramic, then the above step of forming the insulating layer can be eliminated.

In FIG. 1*d* is shown an isometric top view of the substrate 10 with the silicon oxide insulated holes 3 and 4. Although only two holes 3 and 4 of a rectangular shape are shown by way of illustration, any number of holes, shape and size of holes, and hole pattern can be used depending on the particular circuit to be fabricated.

Figure 1E:
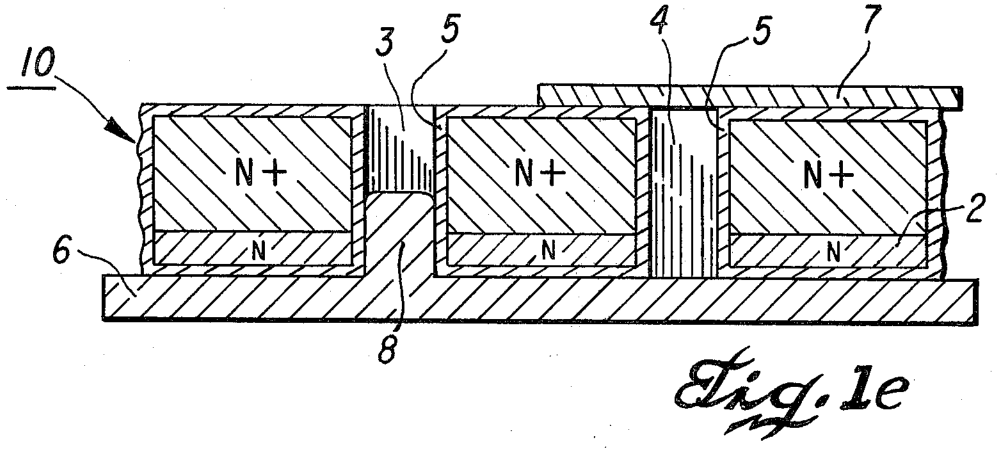

The substrate 10 is then placed on a flat polished surface of the seed crystal 6, the seed crystal being a single crystal of the same semiconductor material to be epitaxially grown within the hole 3, for example. Where the substrate 10 is of N+ conductivity type with an epitaxial layer of N conductivity type on a surface thereof as shown in FIGS. 1*a*–1*d*, the substrate is placed with the N conductivity type layer 2 face down on the seed crystal 6 as shown in FIG. 1*e*. For optimum results, the opposing surfaces of the seed crystal 6 and the substrate 10 should be as flat and polished as possible to prevent wasteful growth of material between the two opposing surfaces instead of only in the open holes. On the other hand, if the substrate is wholly of one conductivity type, such as P or N, for example, or no conductivity type, as would be the case with a ceramic substrate, the substrate would be placed on the seed crystal with either of the major faces down on the crystal. If more than one type of semiconductor material is desired in the holes 3 and 4, respectively, of the substrate 10, one hole, in this case hole 4, by way of illustration, is blocked off, as shown in FIG. 1*e*, by placing a strip of material 7 that can withstand the deposition temperatures over the hole 4 and prevent the epitaxial gases from entering hole 4. A convenient blocking material is a scrap wafer of silicon. It should be noted that the substrate 10 shown in FIG. 1*e* is inverted from the position as shown in FIG. 1*c*. The substrate is then returned to its original orientation in FIG. 1*h*.

The illustrated embodiment of the process steps of the invention shows all of the required number of holes formed before the beginning of successive depositions of different semiconductor materials in different holes. However, only the holes to be filled with a specific semiconductor material need be formed before the deposition of that specific material, thus eliminating the need for the blocking strip 7.

The assembly of the substrate 10, seed crystal 6, and the blocking strip 7 is placed within a conventional reactor furnace (not shown). The conditions in the reactor furnace necessary to form the semiconductor island 8 within the hole 3 depends, of course, on the particular semiconductor material desired. For instance, a suitable deposition temperature for depositing gallium arsenide (GaAs) from a mixture of arsenic, hydrogen and gallium chloride is about 750°C; a suitable deposition temperature for depositing indium arsenide (InAs) from a mixture of arsenic, hydrogen and indium chloride is about 720°C; a suitable deposition temperature for depositing cadmium sulfide (CdS) from cadmium and sulfur is about 1200°C; a suitable deposition temperature for depositing germanium (Ge) from germanium tetrachloride ($GeCl_4$) and hydrogen is about 900°C, and from germanium hydride (GeH) it is about 650°C; a suitable deposition temperature for depositing silicon (Si) from silicon tetrachloride ($SiCl_4$) and hydrogen is about 1200°C, and from silicon hydride ($SiH_4$) it is about 800°C.

The processes of epitaxially depositing the semiconductor materials above mentioned are well known in the art and need not be mentioned in detail here, as they are basically described in various texts on transistor technology; for example, silicon deposition is described in SILICON SEMICONDUCTOR TECHNOLOGY, McGraw-Hill Book Company (1965). Suffice it to say, that the epitaxial deposition of the material is allowed to continue until the island 8 is deposited or grown in sufficient quantity within the hole 3 to enable component fabrication, the height of the island usually being in the order of about 2 to 5 millinches. The hole 3 can be completely filled with the semiconductor material where the air space left in an incompletely filled hole is detrimental to the function of the circuit component formed in the island, for example, due to the poor heat dissipation of the air space. When heat dissipation is not a problem, the hole need not be filled, for only about 2 to 5 millinches of material is necessary to give an island enough strength for subsequent handling during component fabrication, thus reducing the deposition time of island formation. The composition of the atmosphere within the reactor will normally be determined by the semiconductor material of the seed crystal 6, the material of the seed crystal being the same as one of the constituents in the gaseous phase within the reactor that penetrates the hole upon the crystal and grown therefrom as a single crystal with the same crystal orientation as the seed crystal itself. If any semiconductor material deposits upon substrate 10 during the deposition operation, it can be easily removed by a subsequent lapping operation. The semiconductor material grown within the hole 3 adheres tightly to the sides of the hole 3 and is not dislodged by subsequent handling.

Figure 1F:
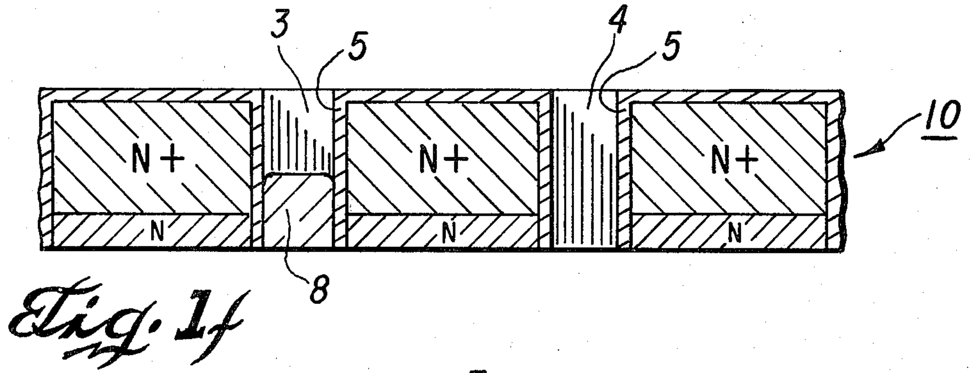

After the island 8 has been formed, the assembly of the substrate 10, seed crystal 6, and bb cking strip 7 is removed from the furnace. The blocking strip 7 is easily lifted off while the seed crystal 6 can be substantially removed by lapping, or chemically etching, leaving the material 8 in hole 3 of the substrate, as illustrated in FIG. 1*f*.

Figure 1G:
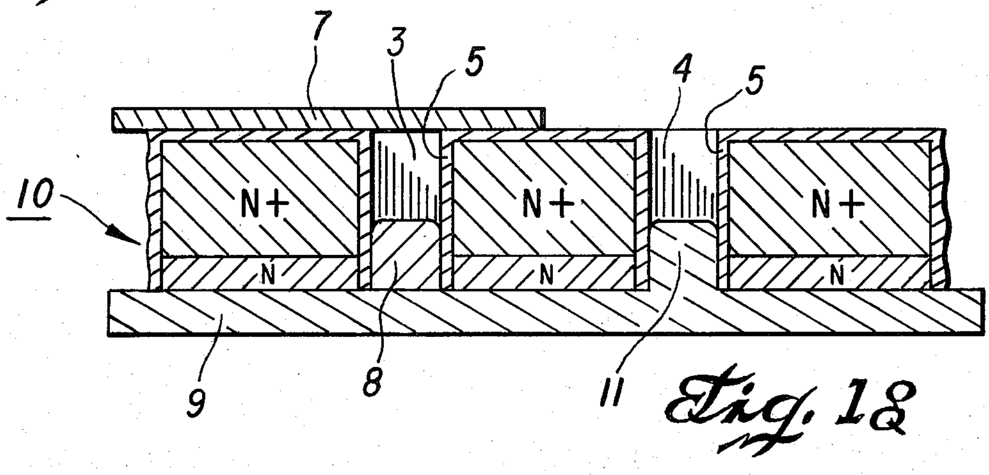

To fill the hole 4 with the same or different semiconductor material, the previously described deposition process is repeated. The blocking strip 7 is now placed over the partially filled hole 3, as shown in FIG. 1*g*, to prevent any additional deposition of material therein, and substrate 10 is placed on the seed crystal 9 for example, of a different semiconductor material. The assembly of the substrate 10, seed crystal 9 and the blocking strip 7 is placed in the reactor furnace in order to deposit the second semiconductor type material 11 on the seed crystal 9 within the hole 4. The deposition is allowed to continue until a sufficient quantity of single crystal semiconductor material 11 is grown, as illustrated in FIG. 1*g*. After the island 11 has been formed, the assembly of the substrate 10, seed crystal 9 and the blocking strip 7 is removed from the furnace. The blocking strip 7 is lifted off while as described before in connection with hole 3, the seed crystal 9 is substantially removed as previously explained, leaving the semiconductor material 8 in hole 3 and the semiconductor material 11 in hole 4.

Figure 1H:
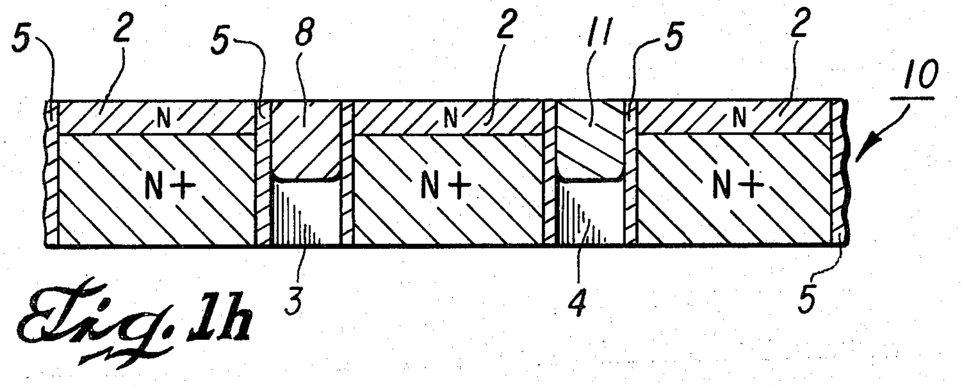

The substrate 10 is now inverted and ready for circuit component fabrication, as shown in FIG. 1*h*, which illustrates a semiconductor substrate 10 of one semiconductor material, silicon in this example, containing islands 8 and 11, each made of a different semiconductor material. The remaining silicon oxide layer 5 as seen in FIG. 1*g* on the surface of the substrate opposite the N conductivity layer 2 has been removed for bonding the substrate to a header. A feature of the invention is the flexibility as to the number of different semiconductors that can be incorporated and integrated in one substrate. In addition, instead of using a different semiconductor material in each of the islands and different from the substrate itself, the same semiconductor material can be deposited in all the islands but with a different single crystal orientation than that of the substrate. Different crystal orientations are utilized where different depths of impurity diffusions are desired to be obtained in a single diffusion step. For instance, in a silicon substrate having a crystal orientation on the ( 100 ) plane, a hole can be formed in which an island of silicon is formed having a ( 111 ) plane orientation by epitaxially depositing in the hole silicon material grown from a seed crystal having the ( 111 ) plane orientation. Where diffusion is to be effected both in the silicon substrate and in the island, different depth regions can be formed in one diffusion step due to the faster rate of diffusion in the ( 100 ) direction than in the ( 111 ) direction. The difference in etch rates of the different crystal orientations can also be utilized advantageously for certain arrangements and fabrication techniques.

FIG. 2 illustrates a substrate 20 that has P conductivity type silicon material 21 grown in the hole 22 of an N+ conductivity type silicon starting substrate 23, and an N conductivity type silicon layer 24 epitaxially deposited on the surface 25 of the starting substrate 23 according to the process as previously described. The P-N-P transistor $T_1$ is formed in the grown island of silicon material 21 by conventional means. The N-P-N transistor $T_2$ is also conventionally formed and has an N+ conductivity type contact region 26 which makes a low resistance path to the N+ conductivity substrate 23 acting as a collector contact region. Metallic contacts, for example expanded contacts 27*a* through

27*f*, make electrical contact through a protective oxide layer 28 to the different regions of the transistors $T_1$ and $T_2$. The silicon oxide layer 29 within the hole 22 electrically isolates the transistor $T_1$ from the remainder of the substrate 20 and from transistor $T_2$. Transistors, diodes and resistors (not shown) can also be formed in other islands or in the substrate itself.

In FIG. 3*a* is shown a schematic diagram of an emitter-coupled logic circuit. Transistors $Q_1$ through $Q_6$ are high speed transistors and $Q_7$ is a power transistor. For the best performance of both types of transistors, the high speed transistors are made from germanium and the power transistor from silicon.

FIG. 3*b* illustrates, in cross-section, a portion of the circuit shown in FIG. 3*a* in monolithic integrated circuit form. The substrate 30 is N+ conductivity type silicon with an epitaxially grown layer 31 of N conductivity type silicon in which the power transistor $Q_7$ is formed. The emitter terminal 32 makes ohmic electrical contact with the emitter region 33, the base terminal 34 makes ohmic electrical contact with the base region 35, while the collector terminal 36 makes ohmic electrical contact to the collector region 37 through the N+ collector contact region 38. A silicon oxide layer 39 protects the surface of the substrate and electrically isolates the terminals of the transistors $Q_6$ and $Q_7$ from each other.

The high speed transistors $Q_1$ through $Q_6$ are formed in islands of germanium material formed as previously described in the silicon substrate 30 with only the high speed transistor $Q_6$ being illustrated in FIG. 3*b*. The transistor $Q_6$ is formed in an island of germanium material 40, a portion of which forms the collector region. Collector terminal 41 makes ohmic electrical contact to the collector region 40, the base terminal 42 makes ohmic electrical contact to the base region 43, while the emitter contact 44 makes ohmic electrical contact to the emitter region 45. The transistor $Q_6$ is electrically isolated from the substrate 30 by the layer of oxide 46 lining the inner walls of the hole 47. The oxide layer 39 also covers the surface of the transistor $Q_6$. By forming the switching transistors $Q_1$ through $Q_6$ in islands of germanium and the power transistor $Q_7$ in the silicon substrate, the faster switching speeds obtainable from germanium transistors and the greater power capabilities of silicon transistors can be used to obtain a much more efficient emitter-coupled logic circuit than can be obtained with a monolithic integrated circuit of only one semiconductor material.

A portion of a light emitting diode array for read-only memory applications is shown in FIG. 4*a*. Two rows or lines 50 and 51 of identically coupled diodes are formed in islands 52 of gallium arsenide (GaAs) formed as previously explained according to the invention in a silicon substrate 46. Since the diode line 51 is identical with the diode line 50, only the diode line 50 is described. Electrical connection to the diode line 50 is made to the anode terminal 53 of diode 60 through the protective oxide layer 63. The cathode terminal 54 of the diode 60 is electrically connected in common with the anode 55 of the diode 61 while the cathode 56 of the diode 61 is connected in common to the anode 57 of the diode 62. This connection sequence is continued until the desired number of diodes in the diode line 50 is obtained. A layer 64 of gallium arsenic phosphide forms a ground plane on the substrate surface opposite the diode terminals. Terminal 68 makes electrical contact to the ground plane 64 through the substrate 46.

A cross-section across diode 61 of the diode line 50 along the line 4*b*–4*b* of FIG. 4*a* and an identically constructed diode of diode line 51 (not described) is illustrated in FIG. 4*b*. The island 52 of gallium arsenide (GaAs) is formed as previously described except that the deposition of the gallium arsenide is allowed to continue until the hole (not shown) is completely filled. The island 52 is electrically isolated from the substrate 46 by the oxide layer 58. The anode terminal 55 makes contact to the anode region 59 through the oxide layer 63 while the cathode terminal 56 makes contact to the cathode region 52. The oxide layer 67 on the opposite surface of the gallium arsenide island 52 from the terminals 55 and 56 is formed to electrically isolate the diode 61 from the gallium arsenic phosphide ground plane 64 which is deposited across the entire surface 65 of the substrate 46 and surface 66 of the oxide layer 67. Electrical contact from terminal 68 to the ground plane 64 is made through the silicon substrate 46. The gallium arsenic phosphide ground plane 64 and the silicon oxide layer 67 are transparent to the wavelength emitted by the gallium arsenide diodes while the silicon oxide layer 67 electrically insulates the diode 61 from the ground plane 64. The silicon substrate 46 is opaque to the emitting wavelength, thereby preventing "cross talk" between adjacent diodes.

While the invention has been described with reference to a specific method and a number of preferred embodiments, it is to be understood that this description is not to be construed in the limiting sense. Thus, although the method of the invention has been described in the order of first producing the islands of semiconductor materials in a substrate and then forming the components of an integrated circuit in the islands and in the substrate, the order of production is reversible for certain combinations of semiconductor materials. For example, gallium arsenide islands can be formed after circuit components have been formed in a silicon substrate. Further, although islands of different semiconductor materials have been described as formed in a semiconductor substrate and utilized therein for components of integrated circuits, similar islands can be formed in an insulating or metallic substrate for similar purposes. Various other modifications of the invention may become apparent to persons skilled in the art without departing from the spirit and scope of the invention as defined by the appended claims.

What is claimed is:

1. A semiconductor substrate for manufacturing an integrated circuit comprising:

a. at least two semiconductor regions of monocrystalline semiconductor material disposed so as to be closely spaced from each other and so as to have a common plane surface, the plane surfaces of said semiconductor regions lying in said common plane surface lying in parallel to crystal planes different from each other, respectively, and b. an insulating material region filling the gap between said semiconductor regions to isolate electrically said regions from each other but unitarily combine the regions.

2. The semiconductor substrate according to claim 1, wherein the plane surface of one of said semiconductor regions lies in parallel to a (111) plane while the plane surface of the other of said semiconductor regions lies in parallel to a (100) plane.

3. An integrated circuit comprising:

a plurality of semiconductor regions of monocrystalline semiconductor material electrically isolated from each other and having a common plane surface, the plane surfaces of at least two of said semiconductor regions lying in said common plane surface lie in parallel to crystal planes different from each other, respectively, each of said semiconductor regions including at least one PN junction extending to said common plane surface to form a desired circuit element; and a means for supporting said plurality of semiconductor regions unitarily.

4. The semiconductor substrate according to claim 3 wherein the plane surface of one of said semiconductor region lies in parallel to a [100] plane while the plane surface of the other of said semiconductor regions lies in parallel to a [100] plane.

* * * * *